United States Patent
Miyahara et al.

(10) Patent No.: US 8,975,139 B2
(45) Date of Patent: Mar. 10, 2015

(54) MANUFACTURING METHOD OF SILICON CARBIDE SEMICONDUCTOR DEVICE

(75) Inventors: Shinichiro Miyahara, Nagoya (JP); Toshimasa Yamamoto, Ichinomiya (JP); Hidefumi Takaya, Toyota (JP); Masahiro Sugimoto, Toyota (JP); Yukihiko Watanabe, Aichi-gun (JP); Narumasa Soejima, Aichi-gun (JP); Tsuyoshi Ishikawa, Aichi-gun (JP)

(73) Assignees: DENSO CORPORATION, Kariya (JP); Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 14/000,901

(22) PCT Filed: Sep. 4, 2012

(86) PCT No.: PCT/JP2012/005591
§ 371 (c)(1),
(2), (4) Date: Aug. 22, 2013

(87) PCT Pub. No.: WO2013/042327
PCT Pub. Date: Mar. 28, 2013

(65) Prior Publication Data
US 2013/0330896 A1 Dec. 12, 2013

(30) Foreign Application Priority Data
Sep. 22, 2011 (JP) .................. 2011-207181

(51) Int. Cl.
*H01L 21/336* (2006.01)
*H01L 29/66* (2006.01)
(Continued)

(52) U.S. Cl.
CPC .... *H01L 29/66666* (2013.01); *H01L 29/66068* (2013.01); *H01L 29/7813* (2013.01); *H01L 21/3065* (2013.01); *H01L 29/34* (2013.01); *H01L 29/4236* (2013.01); *H01L 29/1608* (2013.01)
USPC ................ 438/270; 438/795; 257/76; 257/77

(58) Field of Classification Search
USPC ................ 438/270, 795; 257/76, 77
See application file for complete search history.

(56) References Cited

U.S. PATENT DOCUMENTS

2004/0134418 A1* 7/2004 Hirooka .................. 117/101
2005/0001217 A1* 1/2005 Kusumoto et al. .......... 257/77
(Continued)

FOREIGN PATENT DOCUMENTS

JP 10-150191 A 6/1998
JP 3489358 B2 1/2004
(Continued)

OTHER PUBLICATIONS

International Search Report of the International Searching Authority mailed Nov. 13, 2012 for the corresponding international application No. PCT/JP2012/005591 (with English translation).
(Continued)

*Primary Examiner* — Zandra Smith
*Assistant Examiner* — John M Parker
(74) *Attorney, Agent, or Firm* — Posz Law Group, PLC

(57) ABSTRACT

A manufacturing method of a silicon carbide semiconductor device includes: forming a drift layer on a silicon carbide substrate; forming a base layer on or in a surface portion of the drift layer; forming a source region in a surface portion of the base layer; forming a trench to penetrate the base layer and to reach the drift layer; forming a gate electrode on a gate insulation film in the trench; forming a source electrode electrically connected to the source region and the base layer; and forming a drain electrode on a back surface of the substrate. The forming of the trench includes: flattening a substrate surface; and etching to form the trench after flattening.

17 Claims, 9 Drawing Sheets

(51) Int. Cl.
*H01L 29/78* (2006.01)
*H01L 21/3065* (2006.01)
*H01L 29/34* (2006.01)
*H01L 29/423* (2006.01)
*H01L 29/16* (2006.01)

(56) References Cited

U.S. PATENT DOCUMENTS

2008/0220620 A1 9/2008 Kawada et al.
2009/0283776 A1 11/2009 Iwamuro

FOREIGN PATENT DOCUMENTS

JP 2006-114632 A 4/2006
JP 2007-115875 A 5/2007

OTHER PUBLICATIONS

Written Opinion of the International Searching Authority mailed Nov. 13, 2012 for the corresponding international application No. PCT/JP2012/005591 (with English translation).

* cited by examiner

Ra OF SUBSTRATE SURFACE = 100nm
Ra OF TRENCH SIDE SURFACE = 100nm

SiC    GATE ELECTRODE    GATE OXIDE FILM

Ra OF SUBSTRATE SURFACE = 1nm
Ra OF TRENCH SIDE SURFACE = 10nm

SiC    GATE ELECTRODE    GATE OXIDE FILM

MANUFACTURING METHOD OF SILICON CARBIDE SEMICONDUCTOR DEVICE

CROSS REFERENCE TO RELATED APPLICATIONS

This application is a U.S. national stage application of PCT/JP2012/005591 filed on Sep. 4, 2012, and claims priority to, and incorporates by reference, Japanese Patent Application No. 2011-207181 filed on Sep. 22, 2011.

CROSS REFERENCE TO RELATED APPLICATION

This application is based on Japanese Patent Application No. 2011-207181 filed on Sep. 22, 2011, the disclosure of which is incorporated herein by reference.

TECHNICAL FIELD

The present disclosure relates to a manufacturing method of a silicon carbide (i.e., SiC) semiconductor device having a transistor with a vertical type trench gate structure.

BACKGROUND ART

Conventionally, a SiC semiconductor device having a vertical type MOSFET as a transistor with a vertical type trench gate structure is disclosed (for example, Patent Document No. 1). The vertical type MOSFET has a structure such that a P conductive type base region is formed on a N− conductive type drift layer, a N+ conductive type source region is formed in a surface portion of the P conductive type base region, a trench is formed to penetrate the N+ conductive type source region and the P conductive type base region and to reach the N− conductive type drift layer, and a gate electrode and a gate oxide film are embedded in the trench. The vertical type MOSFET having the above structure has the number of channels per unit area, which is larger than a planar type power MOSFET, so that a on-state resistance is reduced.

In the SiC semiconductor device having a transistor with a trench gate structure or the like, a high channel mobility and reliability of the gate oxide film are important factor for deciding a device performance. The high channel mobility and the reliability of the gate oxide film are affected by flatness (i.e., smoothness) of a trench side surface. Thus, it is preferably to form the gate oxide film on an inner wall of the trench having flatness as much as possible.

However, the trench side surface of the transistor having the conventional trench gate structure has a surface roughness Ra in a range between a few nanometers and a few tens nanometers. Thus, the flatness is not good.

The present inventors have studied about the above trench gate structure. As a result, the following knowledge is obtained. FIGS. 8A to 8C are diagrams showing states of flatness of a trench side surface when the trench is formed. FIG. 8A is a photograph showing a state of a trench side surface, FIG. 8B is a schematic diagram of FIG. 8A, and FIG. 8C is a cross sectional view seeing along line VIIIC-VIIIC in FIG. 8A. FIGS. 8A and 8B correspond to diagrams seeing the side surface of the trench along an oblique direction. FIG. 8C corresponds to a diagram seeing the trench from above under a condition that an up-down direction of the drawing is defined as a longitudinal direction of the trench. As shown in FIGS. 8A to 8C, a concavity and a convexity are formed on the trench side surface, so that the flatness is worsened. In order to obtain a preferable channel mobility and reliability of the gate oxide film, it is required that the surface roughness Ra of the trench side surface is equal to or smaller than 10 nanometers, and preferably, the surface roughness Ra as the flatness is equal to or smaller than 1 nanometer. Under the present situations, the sufficient channel mobility and reliability of the gate oxide film are not obtained.

PRIOR ART LITERATURES

Patent Literature

Patent Document No. 1: JP-B2-3489358

SUMMARY OF INVENTION

It is an object of the present disclosure to provide a semiconductor device.

According to an aspect of the present disclosure, a manufacturing method of a silicon carbide semiconductor device having a transistor with a trench gate structure includes: forming a drift layer, which is made of silicon carbide and has a first conductive type with an impurity concentration lower than a substrate, on a substrate having the first conductive type or a second conductive type and made of silicon carbide; forming a base layer, which has the second conductive type and is made of silicon carbide, on or in a surface portion of the drift layer; after implanting an first conductive type impurity as an ion in a surface portion of the base layer, activating the ion-implanted first conductive type impurity so that a source region made of silicon carbide and having the first conductive type with an impurity concentration higher than the drift layer is formed; forming a trench by an etching method so as to penetrate the base layer and to reach the drift layer; forming a gate insulation film on an inner surface of the trench; forming a gate electrode on the gate insulation film in the trench; forming a source electrode electrically connected to the source region and the base layer; and forming a drain electrode on a back surface of the substrate. The forming of the trench includes: flattening a substrate surface before forming the trench; and etching to form the trench after flattening.

In the above method, a flattening step is performed to improve the flatness of the substrate surface before forming the trench. Accordingly, when the trench is formed, it is possible to improve the flatness of the side surface of the trench. Thus, the channel mobility and the reliability of the gate are improved in the transistor having the trench gate structure.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

First Embodiment

A first embodiment of the present disclosure will be explained. Here, an inversion type vertical MOSFET as a transistor having a trench gate structure equipped in a SiC semiconductor device will be explained as an example.

Figure 1:
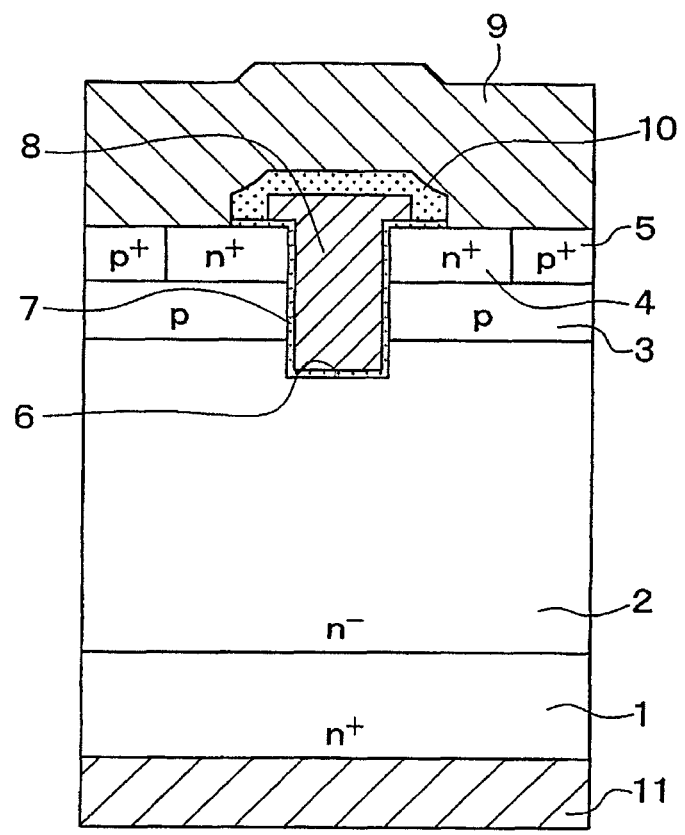
FIG. 1 is a cross sectional view of a SiC semiconductor device according to a first embodiment of the present disclosure.

FIG. 1 is a cross sectional view of a vertical MOSFET having a trench gate structure according to the present embodiment. FIG. 1 corresponds to one cell of the MOSFET retrieved from the device. Although FIG. 1 shows only one cell of the MOSFET, multiple rows of MOSFETs having a similar structure as the MOSFET shown in FIG. 1 are adjacently arranged to each other.

In the MOSFET shown in FIG. 1, a N+ conductive type substrate 1 made of SiC is provided as a semiconductor substrate. The N+ conductive type substrate 1 has a N conductive type impurity concentration such as nitrogen of, for example, $1.0 \times 10^{19}/cm^3$ and a thickness of about 300 micrometers. A N− conductive type drift layer 2 made of SiC is formed on the surface of the N+ conductive type substrate 1. The drift layer 2 has the N conductive type impurity concentration such as nitrogen in a range between $3.0 \times 10^{15}/cm^3$ and $1.0 \times 10^{16}/cm^3$ and a thickness in a range between 10 micrometers and 15 micrometers. The impurity concentration of the N− conductive type drift layer 2 may be constant along a depth direction. Alternatively, the concentration distribution may have gradient. For example, a part of the N− conductive type drift layer 2 on the N+ conductive type substrate side may have a concentration higher than that of another part of the N− conductive type drift layer 2 on a side apart from the N+ conductive type substrate 1. Oppositely, a surface part of the N− conductive type drift layer 2 may have high concentration. Thus, when a part of the N− conductive type drift layer 2 has high impurity concentration, an inner resistance can be reduced. Thus, it is possible to reduce the on-state resistance.

A p conductive type base region 3 is formed on a surface or in a surface portion of the N− conductive type drift layer 2. Further, a P+ conductive type contact layer 5 is formed in an upper portion of the p conductive type base region 3. The contact layer 5 provides a contact region of the N+ conductive type source region 4 and the P conductive type base region 3.

The P conductive type base region 3 has a P conductive type impurity concentration such as boron or aluminum in a range between $5.0 \times 10^{16}/cm^3$ and $2.0 \times 10^{19}/cm^3$ and a thickness of about 2.0 micrometers. The N+ conductive type source region 4 has a N conductive type impurity concentration such as phosphorus in a surface portion thereof (i.e., a surface impurity concentration) of, for example, $1.0 \times 10^{21}/cm^3$ and a thickness of about 0.3 micrometers. The P+ conductive type contact layer 5 has a P conductive type impurity concentration such as boron or aluminum in a surface portion thereof (i.e., a surface impurity concentration) of, for example, $1.0 \times 10^{21}/cm^3$ and a thickness of about 0.3 micrometers.

The P conductive type base region 3, the N+ conductive type source region 4 and the p+ conductive type contact layer 5 are arranged on both sides of a trench gate structure, which will be later described. The N+ conductive type source region 4 and the p+ conductive type contact layer 5, each of which has a linear shape, are alternately arranged so that a stripe pattern is formed. In the present embodiment, a longitudinal direction of each of the N+ conductive type source region 4 and the p+ conductive type contact layer 5 coincides with a longitudinal direction of the trench gate structure.

Further, a trench 6 is formed to penetrate the P conductive type base region 3 and the N+ conductive type source region 4 and to reach the N− conductive type drift layer 2. The trench 6 has a width in a range between 0.7 micrometers and 2.0 micrometers, and a depth equal to or larger than 2.0 micrometers (e.g., 2.4 micrometers). One trench 6 is arranged in each cell. The longitudinal direction of each trench 6 directs to the same direction, so that a stripe pattern is formed. The P conductive type base region 3 and the N+ conductive type source region 4, which are above described, are arranged to contact a side wall of the trench 6.

Further, a gate oxide film 7 corresponding to a gate insulation film covers an inner wall of the trench 6. A gate electrode 8 made of doped poly silicon on a surface of the gate oxide film 7 completely fills in the trench 6. The gate oxide film 7 is formed by a thermal oxidation method or a CVD method on an inner wall of the trench 6. The thickness of the gate oxide film 7 on a sidewall and on a bottom of the trench 6 is commonly about 100 nanometers.

Thus, the trench gate structure is formed. The trench gate structure extends along a perpendicular direction of the drawing as the longitudinal direction. The trench gate structure arranged in each cell is arranged along a right-left direction of the drawing so that a stripe pattern is formed.

A source electrode 9 and a gate wiring (not shown) are formed on the surface of the N+ conductive type source region 4, the P+ conductive type contact layer 5 and the gate electrode 8. The source electrode 9 and the gate wiring are made of multiple metals (for example, nickel/aluminum). At least a part contacting N conductive type SiC (specifically, the N+ conductive type source region 4 and the gate electrode 8 in a case of N conductive type impurity dope) is made of metal, which is capable of ohmic-contacting with the N conductive type SiC. At least a part contacting P conductive type SiC (specifically, the P+ conductive type contact layer 5 and the gate electrode 8 in case of P conductive type impurity dope) is made of metal, which is capable of ohmic-contacting with the P conductive type SiC.

The source electrode 9 and the gate wiring are formed on an interlayer insulation film 10 so that they are electrically insulated. The source electrode 9 is electrically connected to the N+ conductive type source region 4 and the P+ conductive type contact layer 5 via a contact hole, which is formed in the interlayer insulation film 10. The gate wiring is electrically connected to the gate electrode 8 via the contact hole although not shown in the drawing.

A drain electrode 11, which is electrically connected to the N+ conductive type substrate 1, is formed on a backside of the N+ conductive type substrate 1. The above structure provides the N channel inversion type vertical MOSFET having the trench gate structure.

Next, a manufacturing method of the inversion type vertical MOSFET having the trench gate structure according to the present embodiment will be explained. FIGS. 2A to 2C and FIGS. 3A to 3B are cross sectional views showing the manufacturing process of the vertical MOSFET shown in FIG. 1. The method will be explained with reference to these drawings.

Figure 2A:
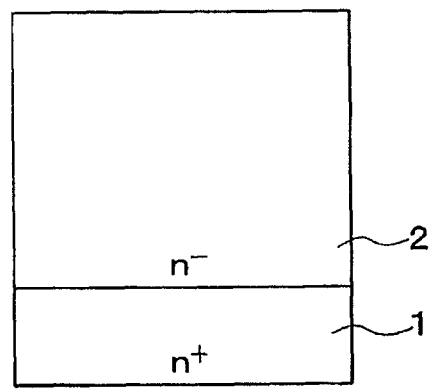
FIG. 2A is a cross sectional view showing a manufacturing process of the SiC semiconductor device shown in FIG. 1.

(Step Shown in FIG. 2A)

First, the N+ conductive type substrate 1 having the N conductive type impurity concentration such as nitrogen of, for example, $1.0 \times 10^{19}/cm^3$ and a thickness of about 300 micrometers is prepared. The N− conductive type drift layer 2 made of SiC is epitaxially grown on the surface of the N+ conductive type substrate 1. The drift layer 2 has the N conductive type impurity concentration in a range between $3.0 \times 10^{15}/cm^3$ and $1.0 \times 10^{16}/cm^3$ and a thickness in a range between 10 micrometers and 15 micrometers.

Figure 2B:
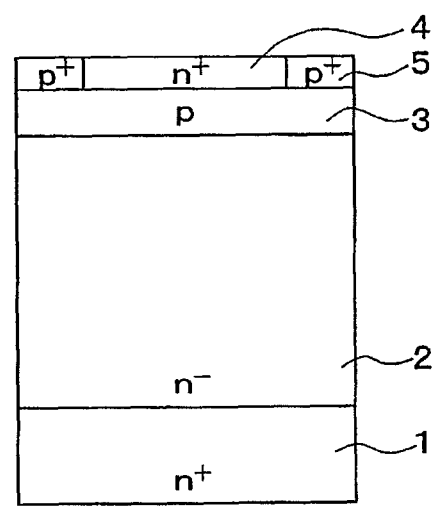
FIG. 2B is a cross sectional view showing the manufacturing process of the SiC semiconductor device in FIG. 1 following FIG. 2A.

(Step Shown in FIG. 2B)

A P conductive type base layer 3 is formed on the surface of the N− conductive type drift layer 2 by epitaxally growing a P conductive type impurity layer, which has a P conductive type impurity concentration such as boron or aluminum in a range between $5.0 \times 10^{16}/cm^3$ and $2.0 \times 10^{19}/cm^3$ and a thickness of about 2.0 micrometers. Here, although the P conductive type base layer 3 is formed by an epitaxial growth, the P conductive type base layer 3 may be formed by implanting a P conductive type impurity as an ion in a surface portion of the N− conductive type drift layer 2.

Then, a mask (not shown) made of a LTO film, for example, is deposited on the P conductive type base layer 3. After a photo-lithography step is performed, an opening is formed in the mask at a P+ conductive type contact layer 5 to-be-formed region. Then, the P conductive type impurity (for example, boron or aluminum) is implanted as an ion. Then, the implanted ion is activated, so that the P+ conductive type contact layer 5 is formed. The contact layer 5 has the P conductive type impurity concentration such as boron or aluminum (i.e., the surface concentration) of, for example, $1.0 \times 10^{21}/cm^3$ and a thickness of about 0.3 micrometers. After that, the mask is removed.

Further, another mask (not shown) is deposited. After a photo lithography step is performed, an opening is formed in the mask at a N+ conductive type source region 4 to-be-formed region. Then, the N conductive type impurity such as nitrogen is implanted as an ion over the mask, so that the N+ conductive type source region 4 is formed. After the mask is removed, an activation anneal process is performed, so that the implanted ion is activated.

Figure 2C:
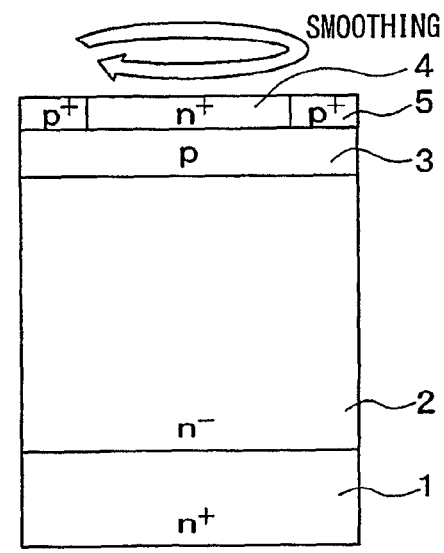
FIG. 2C is a cross sectional view showing the manufacturing process of the SiC semiconductor device in FIG. 1 following FIG. 2B.

(Step Shown in FIG. 2C)

A flattening step for improving the flatness of the substrate surface is performed. Specifically, the surface of the N+ conductive type source region 4 and the surface of the P conductive type base layer 3 are defined as the substrate surface, and the flattening step is performed so as to reduce the surface roughness Ra of the substrate surface to be equal to or smaller than 1 nanometer. The flattening step may be performed by any method. For example, the flattening step may be performed by a CMP (chemical mechanical polishing) method or a CARE (catalyst-referred etching) method. In this case, the surface roughness Ra is equal to or smaller than 1 nanometer. Preferably, the surface roughness Ra may be equal to or smaller than 0.5 nanometers. More preferably, the surface roughness Ra may be equal to or smaller than 0.3 nanometers.

Figure 3A:
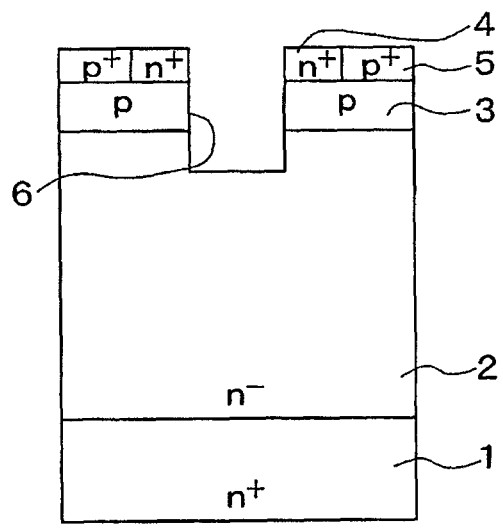
FIG. 3A is a cross sectional view showing the manufacturing process of the SiC semiconductor device following FIG. 2C.

(Step Shown in FIG. 3A)

After an etching mask not shown is deposited on the P conductive type base layer 3, an opening is formed in the etching mask at a trench 6 to-be-formed region. Then, under a condition that the etching mask covers the layer 3, an isotropic etching step is performed with using an etching gas such as $CF_4+O_2$ gas or $Cl_2$ gas so that the trench 6 is formed. Then, the etching mask is removed.

When the above etching is performed, at a step shown in FIG. 2C, the surface roughness Ra of the substrate surface is improved. In this case, it is conformed that the flatness of the sidewall and the bottom of the trench 6 is also improved after the trench 6 is formed. For example, when an assumed surface roughness Ra is 100 nanometers in a case where the flattening of the substrate surface is not performed, the surface roughness Ra of the sidewall and the bottom of the trench 6 is about 100 nanometers. When the surface roughness Ra is 1 nanometer in a case where the flattening of the substrate surface is performed, it is confirmed that the surface roughness Ra of the sidewall and the bottom of the trench 6 is about 10 nanometers.

Figure 4A:
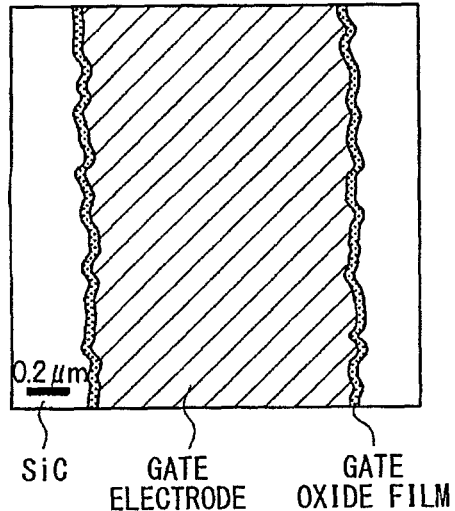
FIG. 4A is a cross sectional view showing a state when a trench 6 is formed in a case where a surface roughness Ra of a substrate surface is 100 nanometers.
Figure 4B:
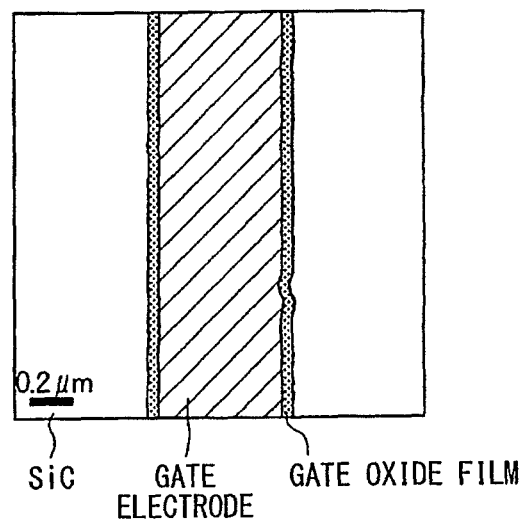
FIG. 4B is a cross sectional view showing a state when a trench 6 is formed in a case where a surface roughness Ra of a substrate surface is 1 nanometer.
Figure 5:
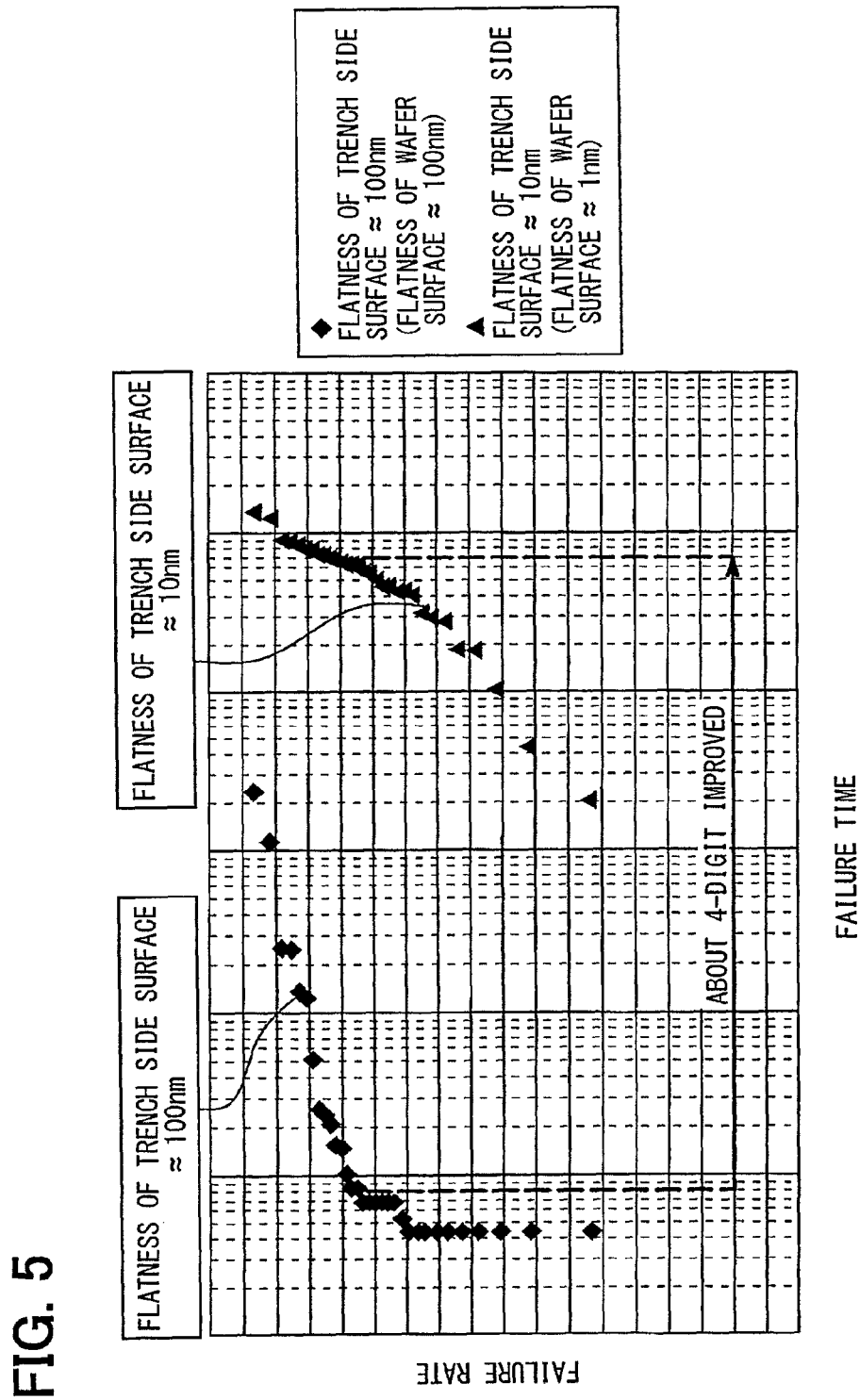
FIG. 5 is a diagram showing a relationship between a failure time and a failure rate in a case where a surface roughness Ra of a substrate surface is 100 nanometers and 1 nanometer.

FIGS. 4A and 4B are cross sectional views showing states of the trench 6, which is formed under a condition that the surface roughness Ra of the substrate surface is 100 nanometers and under a condition that the surface roughness Ra is 1 nanometer, respectively. FIG. 5 shows experimental results of a relationship between a failure time and a failure rate when the trench 6 is formed, and the gate oxide film 7 is formed on the inner wall of the trench 6 under a condition that the surface roughness Ra of the substrate surface is 100 nanometers and under a condition that the surface roughness Ra is 1 nanometer, respectively. As shown in the drawings, when the surface roughness Ra of the substrate surface is 100 nanometers, the surface roughness Ra of the sidewall of the trench 6 is about 100 nanometers. In this case, the failure time is short, and the failure rate is high. On the other hand, when the surface roughness Ra of the substrate surface is 1 nanometer, the surface roughness Ra of the sidewall of the trench 6 is about 10 nanometers. In this case, the failure time is long, so that the lifetime of the gate oxide film 7 is improved by three to four digits.

Thus, a correlation between the flatness of the substrate surface and the flatness of the sidewall of the trench 6 is found. Thus, before the trench 6 is formed, the flattening step is performed to improve the flatness of the substrate surface. The procedure of the trench forming step in the vertical MOSFET having the trench gate structure is performed, in general, in a order of: forming the N+ conductive type source region 4 by the ion implanting method; annealing for activation; forming the trench 6; and forming the gate oxide film 7. After the activation anneal, a step bunching is generated. Further, the step bunching is also generated at the epitaxial growth of SiC. After the step bunching is generated, the trench 6 is formed without performing the flattening step of the substrate surface. In this case, it is considered that the flatness of the sidewall of the trench 6 is reduced. Accordingly, before the trench 6 is formed, the flattening step for improving the flatness of the substrate surface is performed. In this case, when the trench 6 is formed, it is possible to improve the flatness of the sidewall of the trench 6.

Figure 3B:
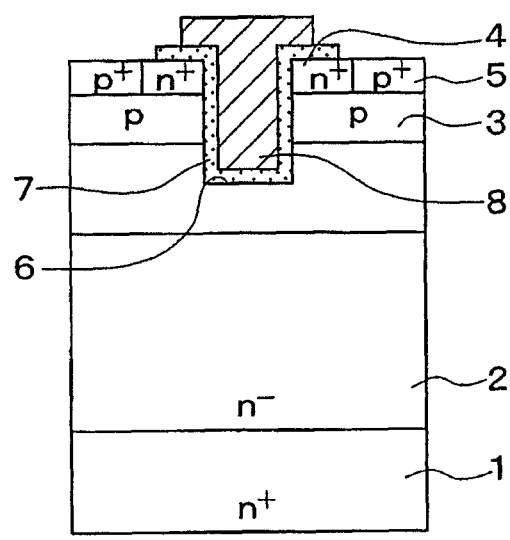
FIG. 3B is a cross sectional view showing the manufacturing process of the SiC semiconductor device following FIG. 3A.

(Step Shown in FIG. 3B)

If necessary, a rounding process of the trench 6 is performed by a hydrogen etching method, a sacrifice oxidation method or a dry etching method. After that, the gate oxide film forming step and a gate electrode forming step are performed. For example, the gate oxide film 7 is formed by a thermal oxidation method or a CVD method. After a poly silicon layer, in which the N conductive type impurity is doped, is deposited on the surface of the gate oxide film 7, an etching back step or the like is performed so that a forming step of the gate oxide film 7 and the gate electrode 8 in the trench 6 is performed.

Although latter steps are not shown in the drawing since the latter steps are similar to a conventional process, the interlayer insulation film 10 is deposited. After that, the interlayer insulation film 10 is patterned, so that the contact hole for connecting to the N+ conductive type source region 4 and the P+ conductive type contact layer 5 is formed. Further, the contact hole for connecting to the gate electrode 8 is formed on a different cross section. Then, electrode material is deposited so as to fill the contact hole. The electrode material is patterned, so that the source electrode 9 and the gate wiring are formed. Further, the drain electrode 11 is formed on the back side of the n+ conductive type substrate 1. The forming order of the source electrode 9 and the like and the drain electrode 11 may be reversed. Thus, the vertical MOSFET shown in FIG. 1 is completed.

As described above, in the manufacturing method of the vertical MOSFET having the trench gate structure according to the present embodiment, before the trench 6 is formed, the flattening step for improving the flatness of the substrate surface is performed. Accordingly, when the trench 6 is formed, it is possible to improve the flatness of the sidewall of the trench 6. Thus, it is possible to improve the channel mobility and the gate reliability of the vertical MOSFET having the trench gate structure.

Specifically, in the present embodiment, the surface roughness Ra relating to the flatness of the substrate surface before forming the trench 6 is reduced to be equal to or smaller than 1 nanometer in the flattening step. Thus, the surface roughness Ra of the sidewall of the trench 6 is reduced to be equal to or smaller than 10 nanometers. It is possible to obtain high channel mobility and high gate reliability.

Further, the flattening step may be performed to reduce the surface roughness Ra of the substrate surface to be equal to or smaller than 0.5 nanometers, more preferably, to be equal to or smaller than 0.3 nanometers. Thus, the variation of the lifetime of the gate oxide film 7 is restricted, so that it is possible to obtain the SiC semiconductor device having higher reliability. In order to reduce the variation to be within a range between +1% and −1%, it is preferable to reduce the surface roughness Ra of the sidewall of the trench 6 to be equal to or smaller than 1% of the thickness of the gate oxide film 7. Accordingly, when the thickness of the gate oxide film 7 is 100 nanometers, it is preferable to reduce the surface roughness Ra of the sidewall of the trench 6 to be equal to or smaller than 1 nanometer. In order to realize this condition, it is conformed that the surface roughness Ra of the substrate surface is reduced to be equal to or smaller than 0.5 nanometers, more preferably to be equal to or smaller than 0.3 nanometers in the flattening step. Accordingly, when the flattening step is performed to reduce the surface roughness Ra of the substrate surface to be equal to or smaller than 0.5 nanometers, more preferably, to be equal to or smaller than 0.3 nanometers, the variation of the lifetime of the gate oxide film 7 is restricted. Thus, it is possible to obtain the SiC semiconductor device having higher reliability.

Second Embodiment

A second embodiment of the present disclosure will be explained. IN the present embodiment, a part of the manufacturing process of the SiC semiconductor device in the first embodiment is changed. Other parts are similar to the first embodiment. Thus, only a different part from the first embodiment will be explained.

Figure 6A:
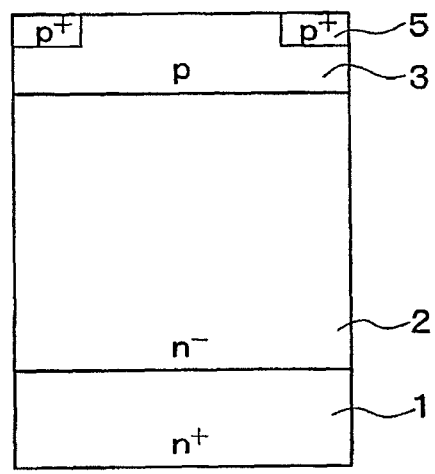
FIG. 6A is a cross sectional view showing a manufacturing process of a SiC semiconductor device according to a second embodiment of the present disclosure.
Figure 6B:
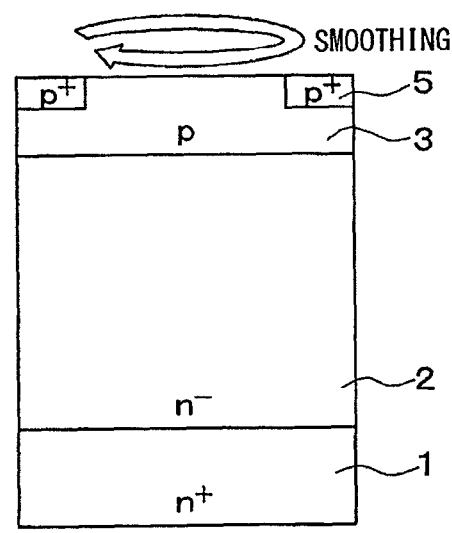
FIG. 6B is a cross sectional view showing the manufacturing process of the SiC semiconductor device according to the second embodiment of the present disclosure following FIG. 6A.
Figure 6C:
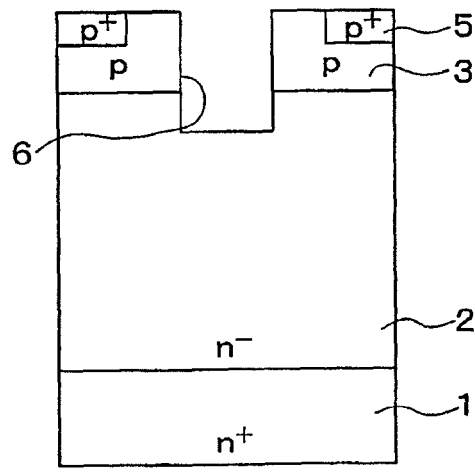
FIG. 6C is a cross sectional view showing the manufacturing process of the SiC semiconductor device according to the second embodiment of the present disclosure following FIG. 6B.

FIGS. 6A to 6C are cross sectional views showing a manufacturing process of the vertical MOSFET according to the present embodiment. With reference to the drawings, a manufacturing method of the vertical MOSFET according to the present embodiment will be explained.

(Step Shown in FIG. 6A)

When steps similar to the steps shown in FIGS. 2A and 2B explained in the first embodiment is executed, the N− conductive type drift layer 2 is formed on the N+ conductive type substrate 1, and the P conductive type base layer 3 is formed on the N− conductive type drift layer 2. Further, the P+ conductive type contact layer 5 is formed at a predetermined position of the P conductive type base layer 3.

(Step Shown in FIG. 6B)

Similar to the step in FIG. 2C, the flattening step for improving the flatness of the substrate surface is performed. Specifically, the surface of the P conductive type base layer 3 is defined as the substrate surface, so that the flattening step for reducing the surface roughness Ra of the substrate surface to be equal to or smaller than 1 nanometer is performed.

(Step Shown in FIG. 6C)

Similar to the step in FIG. 3A, the etching mask having the opening at the trench-to-be-formed region is arranged, and the trench 6 is formed by the anisotropic etching process with using an etching gas such as a $CF_4+O_2$ gas or $Cl_2$ gas, for example. After that, the etching mask is removed. Since the flattening step of the substrate surface is performed before forming the trench 6, the sidewall of the trench 6 formed at that time has the excellent flatness.

Figure 7A:
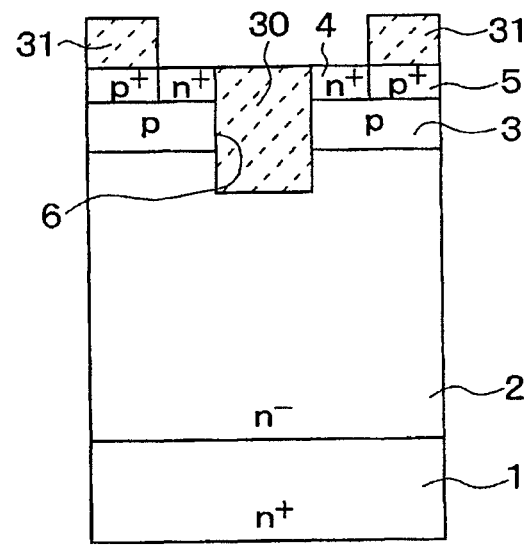
FIG. 7A is a cross sectional view showing the manufacturing process of the SiC semiconductor device following FIG. 6C.

(Step Shown in FIG. 7A)

After the mask 30 is arranged so as to fill in the trench 6, the patterning process is performed so that the mask 30 remains only in the trench 6. Further, the mask 31 is formed on the substrate surface, and the opening is formed in the mask 31 at the N+ conductive type source region 4 to-be-formed position. Then, the ion of the N conductive type impurity (such as nitrogen) is implanted over the masks 30, 31, so that the N+ conductive type source region 4 is formed. After the masks 30, 31 are removed, the activation annealing process is performed so that the ion is activated.

Figure 7B:
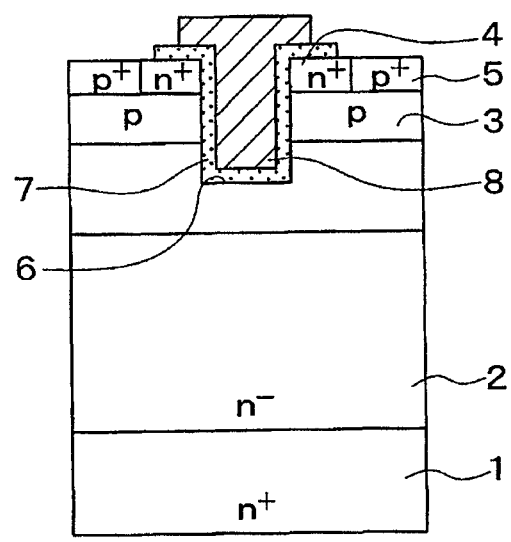
FIG. 7B is a cross sectional view showing the manufacturing process of the SiC semiconductor device following FIG. 7A.
Figure 8A:
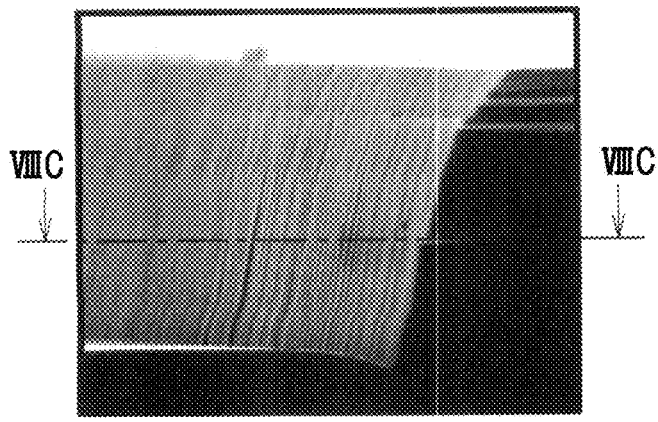
FIG. 8A is a diagram showing a state that a flatness of a trench side surface is studied when the trench is formed, and a photograph showing a state of the trench side surface.
Figure 8B:
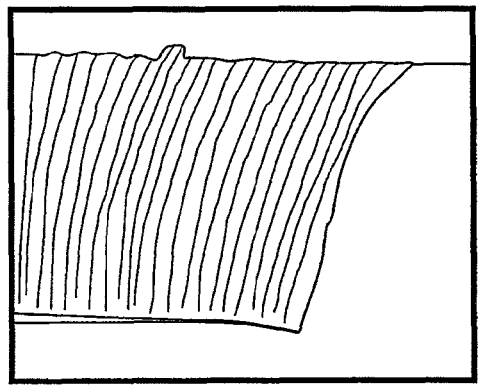
FIG. 8B is a diagram showing a state that a flatness of a trench side surface is studied when the trench is formed, and a schematic view of FIG. 8A.
Figure 8C:
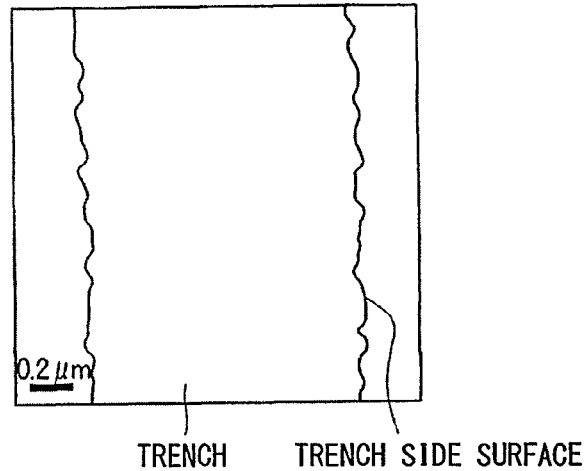
FIG. 8C is a diagram showing a state that a flatness of a trench side surface is studied when the trench is formed, and a cross sectional view seeing along line VIIIC-VIIIC in FIG. 8A.

(Step Shown in FIG. 7B)

Similar to the step in FIG. 3B, if necessary, a rounding process of the trench 6 is performed by a hydrogen etching method, a sacrifice oxidation method or a dry etching method. After that, the gate oxide film forming step and a gate electrode forming step are performed.

Although latter steps are not shown in the drawing since the latter steps are similar to a conventional process, as described in the first embodiment, the interlayer insulation film forming step, the gate wiring and source electrode forming step, and the drain electrode forming step are performed, so that the SiC semiconductor device having a similar structure in FIG. 1 is completed.

As described above, in the present embodiment, after forming the trench 6, the N+ conductive type source region 4 is formed. Thus, in a case where the N+ conductive type source region 4 is formed after forming the trench 6, the flattening step is performed before forming the trench 6 so that the flatness of the sidewall of the trench 6 is improved. Thus, it is possible to improve the channel mobility and the gate reliability in the vertical MOSFET having the trench gate structure.

Other Embodiments

In the above embodiments, the N channel type MOSFET is explained as an example such that the first conductive type is the N conductive type, and the second conductive type is the P conductive type. Alternatively, the present embodiments may be applied to a P channel type MOSFET, in which the conductive type of each element is reversed. Further, in the above explanation, the MOSFET having the trench gate structure is explained as an example. Alternatively, the present embodiments may be applied to an IGBT having a similar trench gate structure. In the IGBT, the conductive type of the substrate 1 in each above embodiment is changed from the N conductive type to the P conductive type, and other structures and the manufacturing methods are similar to the above embodiments.

The present disclosure has the following aspects.

According to an aspect of the present disclosure, a manufacturing method of a silicon carbide semiconductor device having a transistor with a trench gate structure includes: forming a drift layer, which is made of silicon carbide and has a first conductive type with an impurity concentration lower than a substrate, on a substrate having the first conductive type or a second conductive type and made of silicon carbide; forming a base layer, which has the second conductive type and is made of silicon carbide, on or in a surface portion of the drift layer; after implanting an first conductive type impurity as an ion in a surface portion of the base layer, activating the ion-implanted first conductive type impurity so that a source region made of silicon carbide and having the first conductive type with an impurity concentration higher than the drift layer is formed; forming a trench by an etching method so as to penetrate the base layer and to reach the drift layer; forming a gate insulation film on an inner surface of the trench; forming a gate electrode on the gate insulation film in the trench; forming a source electrode electrically connected to the source region and the base layer; and forming a drain electrode on a back surface of the substrate. The forming of the trench includes: flattening a substrate surface before forming the trench; and etching to form the trench after flattening.

In the above method, the flattening step for improving the flatness of the substrate surface is performed before forming the trench. Accordingly, when the trench is formed, it is possible to improve the flatness of the sidewall of the trench. Thus, it is possible to improve the channel mobility and the gate reliability in the transistor having the trench gate structure.

Alternatively, a surface roughness of the substrate surface may be equal to or smaller than 1 nanometer in the flattening of the substrate surface. In this case, when the surface roughness Ra relating to the flatness of the substrate surface is equal to or smaller than 1 nanometer in the flattening step, the surface roughness Ra of the sidewall of the trench is equal to or smaller than 10 nanometers. Thus, the high channel mobility and the gate reliability are obtained.

Alternatively, a surface roughness of the substrate surface may be equal to or smaller than 0.5 nanometer in the flattening of the substrate surface. Further, alternatively, a surface roughness of the substrate surface may be equal to or smaller than 0.3 nanometer in the flattening of the substrate surface. In these cases, the variation of the lifetime of the gate insulation film is restricted, so that it is possible to obtain the SiC semiconductor device having high reliability. In order to reduce the variation within a range between −1% and +1%, it is preferable to reduce the surface roughness Ra of the sidewall of the trench to be equal to or smaller than 1% of the thickness of the gate insulation film. Accordingly, when the thickness of the gate insulation film is about 100 nanometers, it is preferable to reduce the surface roughness Ra of the sidewall of the trench to be equal to or smaller than 1 nanometer. In order to realize this feature, it is preferred that the surface roughness Ra of the substrate surface is equal to or smaller than 0.5 nanometers in the flattening step. More preferably, the surface roughness Ra is equal to or smaller than 0.3 nanometers.

Alternatively, a surface of the source region and a surface of the base region may be flattened as the substrate surface after forming the source region.

Alternatively, a surface of the base region may be flattened as the substrate surface before forming the source region.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A manufacturing method of a silicon carbide semiconductor device having a transistor with a trench gate structure having improved sidewall flatness, the method comprising:

forming a drift layer, which is made of silicon carbide and has a first conductive type with an impurity concentration lower than a substrate, on a substrate having the first conductive type or a second conductive type and made of silicon carbide;

forming a base layer, which has the second conductive type and is made of silicon carbide, on or in a surface portion of the drift layer;

after implanting a first conductive type impurity as an ion in a surface portion of the base layer, activating the ion-implanted first conductive type impurity and forming a source region made of silicon carbide and having the first conductive type with an impurity concentration higher than the drift layer;

forming a trench having improved sidewall flatness by flattening a surface of the source region and directly etching a portion of the flattened surface of the source region, so as to penetrate the base layer and to reach the drift layer;

forming a gate insulation film on an inner surface of the trench;

forming a gate electrode on the gate insulation film in the trench;

forming a source electrode electrically connected to the source region and the base layer; and forming a drain electrode on a back surface of the substrate.

2. The manufacturing method of the silicon carbide semiconductor device according to claim 1, wherein:
the flattening reduces a surface roughness of the surface of the source region to 1 nanometer or less.

3. The manufacturing method of the silicon carbide semiconductor device according to claim 1, wherein:
the flattening reduces a surface roughness of the surface of the source region to 0.5 nanometer or less.

4. The manufacturing method of the silicon carbide semiconductor device according to claim 1, wherein:
the flattening reduces a surface roughness of the surface of the source region to 0.3 nanometer or less.

5. The manufacturing method of the silicon carbide semiconductor device according to claim 1, wherein:
the flattening includes flattening the surface of the source region together with other surfaces of the base layer after forming the source region.

6. The manufacturing method of the silicon carbide semiconductor device according to claim 1, wherein:
an entire surface of the base region including the surface of the source region is flattened before forming the source region.

7. The manufacturing method of the silicon carbide semiconductor device according to claim 1, wherein:
the flattening is performed by a chemical mechanical polishing method or a catalyst referred etching method.

8. The manufacturing method of the silicon carbide semiconductor device according to claim 1, wherein:
in the forming of the trench, the trench penetrates the source region.

9. The manufacturing method of the silicon carbide semiconductor device according to claim 1, wherein:
in the forming of the trench, the trench has a sidewall roughness Ra of ≤10 nm.

10. A manufacturing method of a silicon carbide semiconductor device having a transistor with a trench gate structure having improved sidewall flatness, the method comprising:
forming a drift layer of silicon carbide on a substrate of silicon carbide having a first conductive type or a second conductive type, the drift layer having the first conductive type with an impurity concentration lower than the substrate, forming a base layer on or in a surface portion of the drift layer, the base layer being made of silicon carbide and having the second conductive type;

implanting a first conductive type impurity as an ion in a surface portion of the base layer, and thereafter activating the ion-implanted first conductive type impurity and forming a source region in the surface portion of the base layer, the source region being made of silicon carbide and having the first conductive type with an impurity concentration higher than the drift layer;

forming a trench having improved sidewall flatness by:
flattening a surface of the source region; and
etching a portion of the flattened surface of the source region and forming a trench that penetrates the base layer and reaches the drift layer immediately after the flattening step and prior to forming another transistor functioning layer on or within the flattened surface of the source region;

forming a gate insulating film on an inner surface of the trench;

forming a gate electrode on the gate insulation film in the trench;

forming a source electrode electrically connected to the source region and the base layer; and forming a drain electrode on a back surface of the substrate.

11. The manufacturing method of the silicon carbide semiconductor device according to claim 10, wherein:
the flattening reduces a surface roughness of the surface of the source region to 1 nanometer or less.

12. The manufacturing method of the silicon carbide semiconductor device according to claim 10, wherein:
the flattening reduces a surface roughness of the surface of the source region to 0.5 nanometer or less.

13. The manufacturing method of the silicon carbide semiconductor device according to claim 10, wherein:
the flattening reduces a surface roughness of the surface of the source region to 0.3 nanometer or less.

14. The manufacturing method of the silicon carbide semiconductor device according to claim 10, wherein:
the flattening includes flattening the surface of the source region together with other surfaces of the base layer.

15. The manufacturing method of the silicon carbide semiconductor device according to claim 10, wherein:
the flattening includes flattening an entire surface of the base region including the surface of the source region.

16. The manufacturing method of the silicon carbide semiconductor device according to claim 10, wherein:
the flattening includes a chemical mechanical polishing method or a catalyst referred etching method.

17. The manufacturing method of the silicon carbide semiconductor device according to claim 10, including:
forming the trench with a sidewall roughness Ra of less than or equal to 10 nm.

* * * * *